(12) United States Patent
Choi

(10) Patent No.: US 11,285,714 B2
(45) Date of Patent: Mar. 29, 2022

(54) APPARATUS FOR SECURING PRINTING SCREEN FRAME

(71) Applicant: VONTRONICS CO., LTD., Anyang-si (KR)

(72) Inventor: Soon-Von Choi, Gunpo-si (KR)

(73) Assignee: VONTRONICS CO., LTD., Anyang-si (KR)

(*) Notice: Subject to any disclaimer, the term of this patent is extended or adjusted under 35 U.S.C. 154(b) by 123 days.

(21) Appl. No.: 16/766,509

(22) PCT Filed: Aug. 24, 2018

(86) PCT No.: PCT/KR2018/009769
§ 371 (c)(1),
(2) Date: May 22, 2020

(87) PCT Pub. No.: WO2019/103284
PCT Pub. Date: May 31, 2019

(65) Prior Publication Data
US 2020/0384757 A1    Dec. 10, 2020

(30) Foreign Application Priority Data
Nov. 24, 2017  (KR) .......................... 10-2017-0158269

(51) Int. Cl.
*B41F 15/36*  (2006.01)
*G03F 7/12*  (2006.01)

(52) U.S. Cl.
CPC ................ *B41F 15/36* (2013.01); *G03F 7/12* (2013.01)

(58) Field of Classification Search
CPC .. B41F 15/0813; B41F 15/0845; B41F 15/08; B41M 1/12; B41N 1/248; B41P 2215/50
(Continued)

(56) References Cited

U.S. PATENT DOCUMENTS 5,979,313 A     11/1999  Fromm
6,038,969 A  *  3/2000  Podlipec ................. B41F 15/36
                                                      101/127

(Continued)

FOREIGN PATENT DOCUMENTS

EP         2902199 A1    8/2015
KR    1020110055475 A    5/2011
(Continued)

OTHER PUBLICATIONS

International Search Report of PCT/KR2018/009769, dated Dec. 4, 2018, English translation.
European Search Report of 18880538.6, dated Dec. 11, 2020.

*Primary Examiner* — Leslie J Evanisko
*Assistant Examiner* — Marissa Ferguson-Samreth
(74) *Attorney, Agent, or Firm* — STIP Law Group, LLC

(57) ABSTRACT

An apparatus for securing a printing screen frame is configured so that, when a piston rod moves backward due to the supply of air pressure, tensile force applied to a support frame of a printing screen unit by a coupling protrusion of a tension member is released and the printing screen unit can be replaced, and, when the piston rod moves forward as an elastic spring extends due to the stop of the supply of the air pressure, the coupling protrusion of the tension member is caught on the support frame of the printing screen unit and applies pressure thereto due to elastic force so as to tension the printing screen, and then reverse pressure can be applied thereto by using air pressure, as needed.

8 Claims, 12 Drawing Sheets

(58) Field of Classification Search
USPC .......................... 101/127, 127.1; 38/102.91
See application file for complete search history.

(56) References Cited

U.S. PATENT DOCUMENTS

| | | | | |
|---|---|---|---|---|
| 8,430,027 | B2* | 4/2013 | Shaw ..................... | B41F 15/36 |
| | | | | 101/127.1 |
| 8,904,929 | B2* | 12/2014 | Hall ....................... | B41F 15/36 |
| | | | | 101/127.1 |
| 2019/0077142 | A1* | 3/2019 | Choi ...................... | B41F 15/14 |
| 2019/0152216 | A1* | 5/2019 | Choi ...................... | H01L 21/48 |

FOREIGN PATENT DOCUMENTS

| | | | |
|---|---|---|---|
| KR | 1020140035158 A | 3/2014 | |
| KR | 1020150131494 A | 11/2015 | |
| KR | 101685899 B1 | 12/2016 | |

\* cited by examiner

APPARATUS FOR SECURING PRINTING SCREEN FRAME

CROSS-REFERENCE TO RELATED APPLICATIONS

This application is the U.S. National Phase under 35 U.S.C. § 371 of International Application No. PCT/KR2018/009769 filed on Aug. 24, 2018, which in turn claims the benefit of Korean Application No. 10-2017-0158269, filed on Nov. 24, 2017, the disclosures of which are incorporated by reference into the present application.

TECHNICAL FIELD

The present invention relates to an apparatus for securing a printing screen frame. More particularly, the present invention relates to an apparatus for securing a printing screen frame, which allows a tensile force to be readjusted to tension a printing screen at a desired pressure by using a tension action part of a cylinder method of using elastic force and air pressure.

BACKGROUND ART

Generally, a printing screen unit includes a rectangular printing screen having a pattern of printing apertures, and a support frame having a first and a second pair of interface parts attached fittingly to each pair of edges of the printing screen via connecting members such that the first and second pair of interface parts are opposed to each other, and a first to a fourth corner piece which connect each of the interface parts to each other.

Here, the printing screen is widely used in semiconductor manufacturing technology, and in particular, it is a metal thin film used during solder cream application or exposure work to mount chips to a printed circuit board in surface mount technology.

The printing screen is also called a metal mask or a stencil mask, and has fine printing holes perforated therein according to a predetermined pattern, and is installed and used in equipment such as a screen printer, exposure apparatus, and washing apparatus. When different patterns are required, the printing screen may be replaced.

Though the printing screen is used while being mounted to the support frame, the printing screen is deformed by a squeegee when there is a loosened part on the printing screen, and thus the position of a printing pattern is deviated or the printing pattern is deformed. To prevent this in performing screen printing, a predetermined amount of tensile force is continuously applied to the printing screen so as to maintain the tension of the printing screen, and a detaching function is also required so that when different patterns are required in the printing screen, the printing screen may be replaced frequently.

That is, the printing screen is used by being mounted to equipment such as a screen printer for a printed circuit board via the support frame. Since the printing screen is periodically required to be replaced and cleaned, a lift operation part which allows the printing screen to be detached, and a tension action part which allow tensile force to be applied to the printing screen act as important factors.

Accordingly, the conventional apparatus for securing a printing screen frame proposed in Korean Patent No. 10-1685899 (2016 Dec. 7) by the present applicant is configured such that the printing screen unit 5 is replaced or tensioned by a frame fixing means 20 manufactured in a rectangular frame shape by using multiple mounting frames 30 and multiple corner pieces 40 as illustrated in FIGS. 1, 2A, and 2B.

That is, the mounting frame 30, which is configured to have a predetermined length by extrusion molding and is made of an aluminum material, includes an air pressure supply hole 32 provided in an upper side of a section thereof by being longitudinally formed therethrough along a longitudinal direction thereof, and a cavity 34 provided at a middle of the section by being longitudinally formed therethrough along the longitudinal direction thereof.

In this case, the cavity 34 is configured in a rectangular shape having a right and left width having a size larger than a vertical height, and includes: an operation guide hole 36 longitudinally provided in the middle of the bottom of the cavity along the longitudinal direction of the mounting frame 30; a partition wall 38 provided at the middle of the ceiling thereof, the partition wall being spaced away upwards from the bottom of the cavity 34 such that a lower end of the partition wall does not touch the bottom thereof and being located at the middle of the operation guide hole 36, and longitudinally formed along the longitudinal direction of the mounting frame 30 so as to divide the cavity 34 into an inner cavity 34a and an outer cavity 34b; and the tension action part 50 is provided from the inner cavity 34a to the outer cavity 34b.

While lateral surface protrusions 52a and 52b are located at the inner cavity 34a and the outer cavity 34b, respectively, with the partition wall 38 arranged therebetween, the tension action part 50 is configured to include a tension member 52 slid in a horizontal direction such that a coupling protrusion 52c of a lower surface of the tension action part protrudes through the operation guide hole 36, and is coupled to or separated from the support frame 5b of the printing screen unit 5; a tube 54 located between the lateral surface protrusion 52a of the tension member 52 and the partition wall 38, the tube sliding the tension member 52 toward the inner cavity 34a to release the tensile force when the tube is expanded by air pressure; an elastic member 56 located between the lateral surface protrusion 52b of the tension member 52 and the partition wall 38, the elastic member sliding the tension member 52 toward the outer cavity 34b by elastic force to apply the tensile force to the printing screen when the air pressure is released.

In the conventional apparatus for securing a printing screen frame having the configuration described above, when air is introduced through an inlet 48 of one end of the frame fixing means 20 manufactured in a rectangular frame shape by the multiple mounting frame 30 and corner pieces 40 without separate equipment or additional components, the lift operation part 60 and the tension action part 50 are sequentially operated at intervals of several seconds by adjusting the supply speed of air pressure by an orifice. Accordingly, the lift operation part lifts the printing screen unit 5 to support the edges thereof and at the same time, the tension action part 50 is engaged with each of the edges of the printing screen unit 5 and applies the tensile force to the printing screen such that the printing screen 5a is tightly pulled from all sides.

That is, when high pressure air is introduced into the body 42 of each of the corner pieces 40 from a separate air supply means located outside, the tube 54 is expanded by the air pressure and allows the tension action part 50 to be operated in the direction of releasing the tension as illustrated in FIG. 2(b), so the printing screen unit 5 can be replaced.

In addition, when the air pressure supply to the frame fixing means 20 stops, the air pressure of the tube 54 of the tension action part 50 is released as illustrated in FIG. 2(a). Accordingly, as the elastic member 56 which is compressed extends, the elastic member compresses the tube 54 and at the same time, allows the tension member 52 to slide such that the tension member 52 is horizontally moved from the inner cavity 34a of the mounting frame 30 toward the outer cavity 34b. Accordingly, the coupling protrusion 52c of the tension member 52 is held in a holding step of the support frame 5b of the printing screen unit 5 to be coupled to each other, whereby the printing screen 5a receives the tensile force from all sides and is tightly pulled.

However, the conventional apparatus for securing a printing screen frame having such a configuration is configured such that when the tube 54 is expanded by the supply of air pressure, the coupling protrusion 52c of the tension member 52 is released from the holding step of the support frame 5b of the printing screen unit 5, and when the tube 54 is contracted as the elastic member 56 is extended by stopping the supply of air pressure, the coupling protrusion 52c of the tension member 52 is held in the support frame 5b of the printing screen unit 5 and tensions the printing screen 5a. Accordingly, when the tube 54 is used for a long period, the tube is oxidized or ruptured due to foreign matter and friction, so the replacement of the tube 54 was often inevitable. Furthermore, since the expansion force of the tube 54 and the extending force of the elastic member 56 are not only limited, but also the movement distance of the tension member 52 is limited inside the cavity, it is impossible to make readjustment to a desired tensile force according to the change in the tensile value of the printing screen 5a which stretches during a long period of use.

DISCLOSURE

Technical Problem

The present invention has been proposed to solve the problems in consideration of the existing problems and the objective of the present invention is to propose an apparatus for securing a printing screen frame, which can be used semi-permanently without being deformed or damaged due to foreign matter or friction, and, at the same time, allows tensile force to be readjusted according to change in the tensile value of a printing screen which stretches during a long period of use.

Technical Solution

In order to solve the technical problem, according to an embodiment of the present invention, an apparatus for securing a printing screen frame configured such that a printing screen unit is replaced or tensioned by a frame fixing means manufactured in a rectangular frame shape by using multiple mounting frames having tension action parts therein and multiple corner pieces, the apparatus including: each of the tension action parts comprising: a cylinder tube block provided in a cavity to be coupled to each of the mounting frames by being spaced apart by a predetermined distance from an inner side surface of the cavity of the mounting frame and having multiple cylindrical holes provided on the cylinder tube block along a longitudinal direction thereof, with partition walls arranged at regular intervals between the cylindrical holes, respectively; multiple piston rods inserted tightly into the multiple cylindrical holes, respectively, to be horizontally moved, and having head parts and rod parts; multiple rod covers screwed to outer ends of the multiple cylindrical holes, each of the rod covers having a through hole formed therein such that each of the rod parts tightly passes through the through hole to be horizontally moved; multiple elastic springs fitted between the head parts and the rod covers, respectively, inside the cylindrical holes, each of the elastic springs applying elastic force toward an inside of each of the cylindrical holes; and multiple tension members longitudinally inserted in the cavities of the mounting frames along longitudinal directions thereof, each of the tension members being coupled to an outer end of each of the rod parts at the same time, and being slid in a horizontal direction such that a coupling protrusion of a lower surface of the tension member protrudes through the operation guide hole to be coupled to or separated from a support frame of the printing screen unit.

According to another embodiment of the present invention, an inclined surface may be provided on a bottom of the cavity, the inclined surface decreasing in height from the operation guide hole toward an outer end thereof, and an inclined surface may be provided on an end of a lower surface of the tension member to be correspondingly engaged with the inclined surface of the cavity and be stopped after the tension member is moved by a second pressure, the inclined surface decreasing in height from the coupling protrusion toward an outer end thereof.

According to another embodiment of the present invention, the cylinder tube block may include: the multiple cylindrical holes provided in an inner side surface of the cylinder tube block to be horizontal thereto and to have predetermined depths, with the partition walls arranged at the regular intervals between the cylindrical holes, respectively, along the longitudinal direction of the cylinder tube block; an air press release hole formed in an inner end of each of the partition walls, and defining a passage such that air supplied through a first air inlet of the corner piece pushes the head parts of the piston rods at the same time in a direction of releasing pressure applied to the support frame so that the head parts are moved rearwards; and an air pressure hole formed in a middle of each of the partition walls, and defining a passage such that air supplied through a second air inlet of the corner piece pushes the head parts of the piston rods at the same time in a direction of applying pressure to the support frame so that each of the head parts is moved forwards.

According to another embodiment of the present invention, each of the air press release hole and the air pressure hole may be configured to maintain a predetermined distance from each other in the partition wall and to have the same height and width.

According to another embodiment of the present invention, the air press release hole may be configured such that the air press release hole supplies air to an inner space of the cylindrical hole partitioned by the head part of the piston rod and the air avoids mixing with air passing through the air pressure hole.

According to another embodiment of the present invention, the air pressure hole may be configured such that the air pressure hole may supply air to an outer space of the cylindrical hole partitioned by the head part of the piston rod and the air may avoid mixing with air passing through the air press release hole.

According to another embodiment of the present invention, a stop protrusion may be provided on an outer circumferential surface of the rod part located at a predetermined distance from an end of the rod part, the stop protrusion being caught on the rod cover when the piston rod is moved in a direction of releasing pressure applied to the support frame and controlling the elastic spring such that the elastic spring is not compressed at desired pressure or more.

According to another embodiment of the present invention, the holding grooves may be provided at an inner corner of a ceiling of the cavity and an outer corner of a bottom thereof, respectively, so that the tension action part is held therein and a position thereof is fixed when the tension action part is longitudinally inserted into the cavity in the longitudinal direction thereof, and holding protrusions may be provided at an upper end corner of an inner side surface of the cylinder tube block and a lower end of an outer side surface thereof, respectively, by protruding therefrom to be correspondingly held in the holding grooves of the cavity such that a position of the cylinder tube block is fixed.

Advantageous Effects

The apparatus for securing a printing screen frame according to the present invention is configured so that, when a piston rod moves backward due to the supply of air pressure, tensile force applied to a support frame of a printing screen unit by a coupling protrusion of a tension member is released and the printing screen unit can be replaced, and, when the piston rod moves forward as an elastic spring extends due to the stop of the supply of the air pressure, the coupling protrusion of the tension member is caught on the support frame of the printing screen unit and applies pressure thereto due to elastic force so as to tension the printing screen, and then reverse pressure can be applied thereto by using air pressure, as needed. Accordingly, the apparatus can be semi-permanently used without being deformed or damaged due to foreign matter or friction, and, at the same time, insufficient tensile force can be readjusted according to change in the tensile value of the printing screen which stretches during a long period of use.

DESCRIPTION OF THE REFERENCE NUMERALS IN THE DRAWINGS

Figure 1:
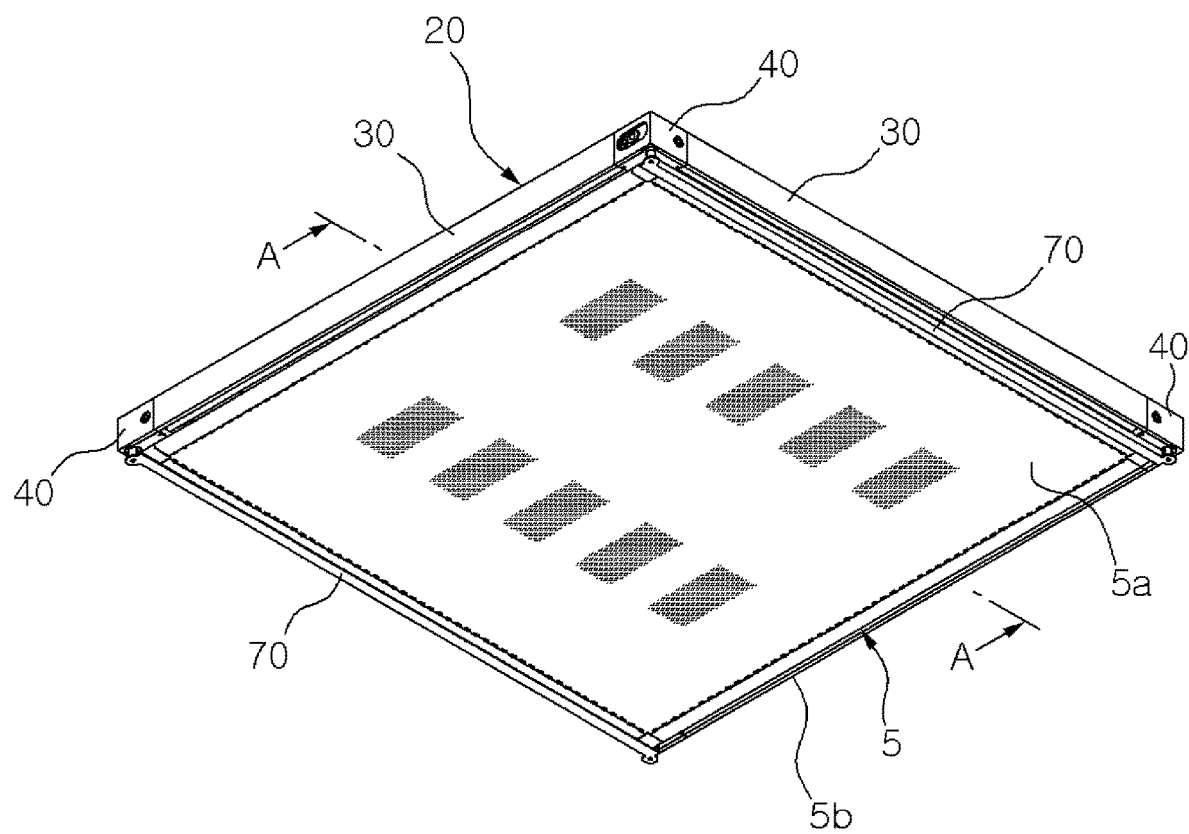
FIG. 1 is a combined perspective view illustrating the state of a printing screen mounted to a conventional apparatus for securing a printing screen frame.
Figure 2A:
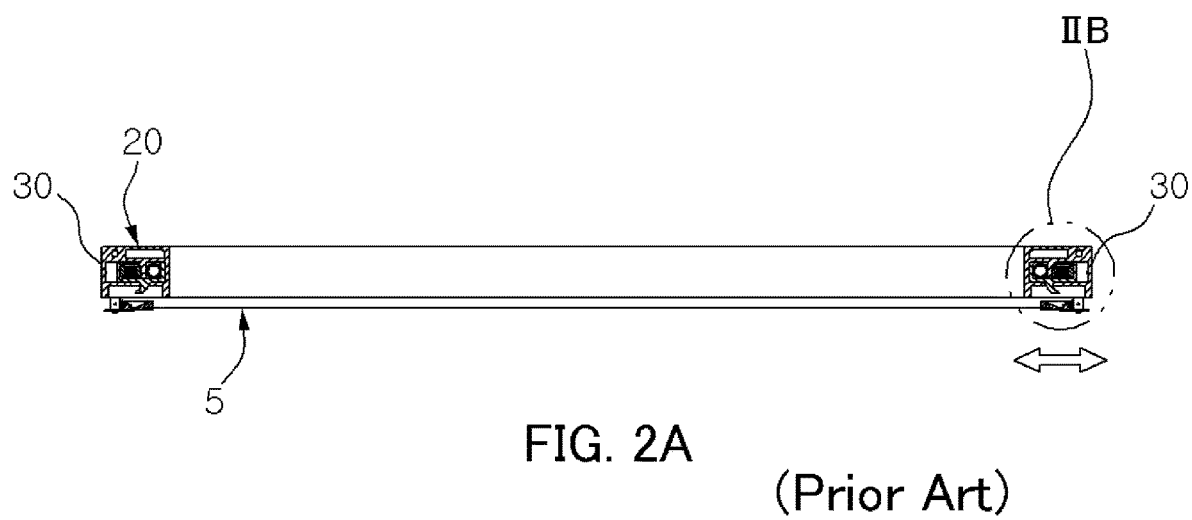
FIGS. 2A and 2B are cross-sectional views of a tension action part taken along line A-A of FIG. 1.
Figure 2B:
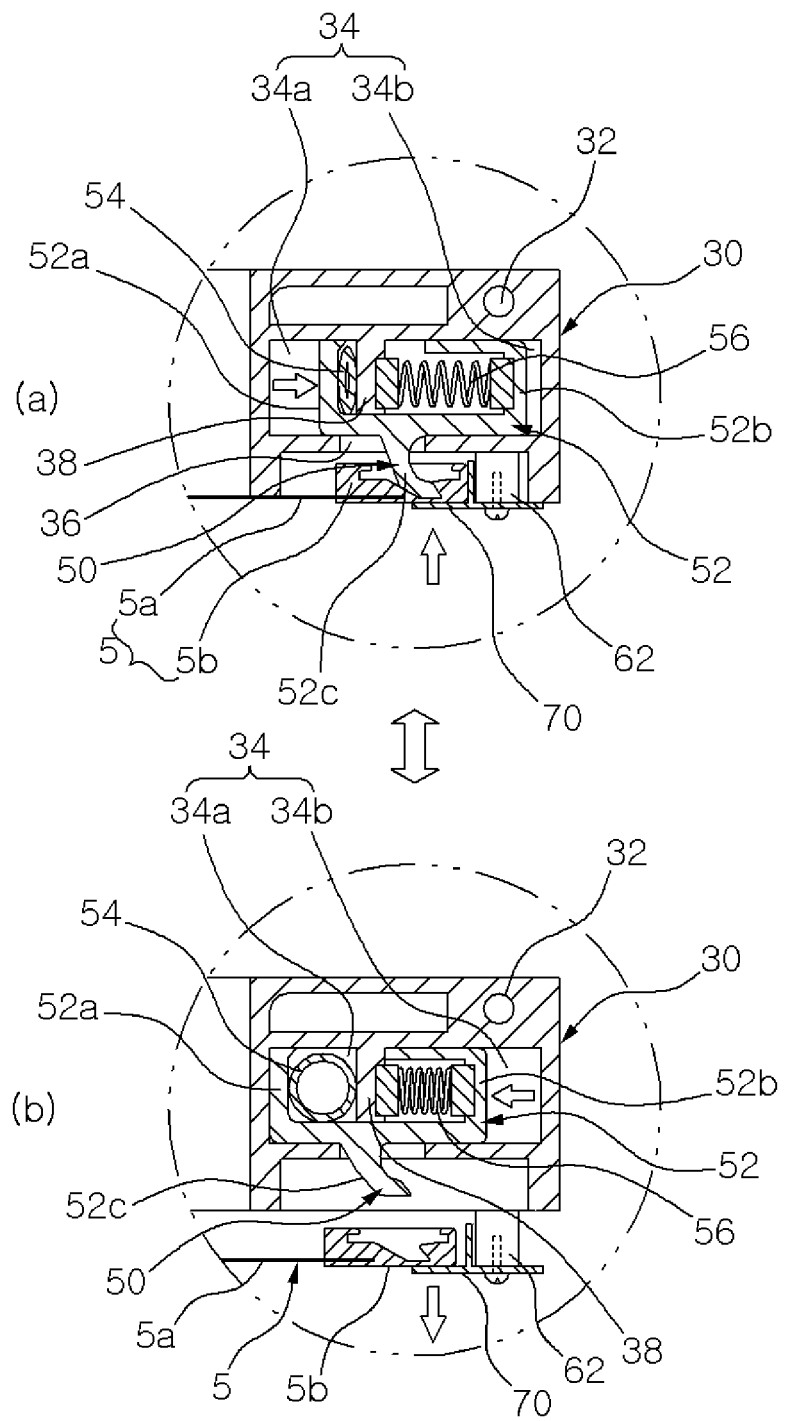

5: Printing screen unit 5a: Printing screen
5b: Support frame 120: Frame fixing means
130: Mounting frame 131: Air pressure supply hole
132: Cavity 133: Operation guide hole
134, 135: Holding groove 136: Inclined surface
140: Corner piece 142: First air inlet
144: Second air inlet 150: Tension action part
151: Cylinder tube block 151a: Cylindrical hole
151b: Partition wall 151c: Air press release hole
151d: Air pressure hole 151e, 151f: Holding protrusion
152: Piston rod 152a: Head part
152b: Rod part 152c: Stop protrusion
153: Rod cover 153a: Through hole
154: Elastic spring 155: Tension member
155a: Coupling protrusion 155b: Inclined surface
156, 157: O-ring 158: Fastening screw
159: O-ring

BEST MODE

Hereinafter, embodiments of the present invention will be described in detail with reference to FIGS. 3 to 8 of the accompanying drawings.

With respect to the present invention, the same names and the same reference numerals are given to the same components as the components of the conventional invention, and duplicate description thereof is omitted.

Figure 3:
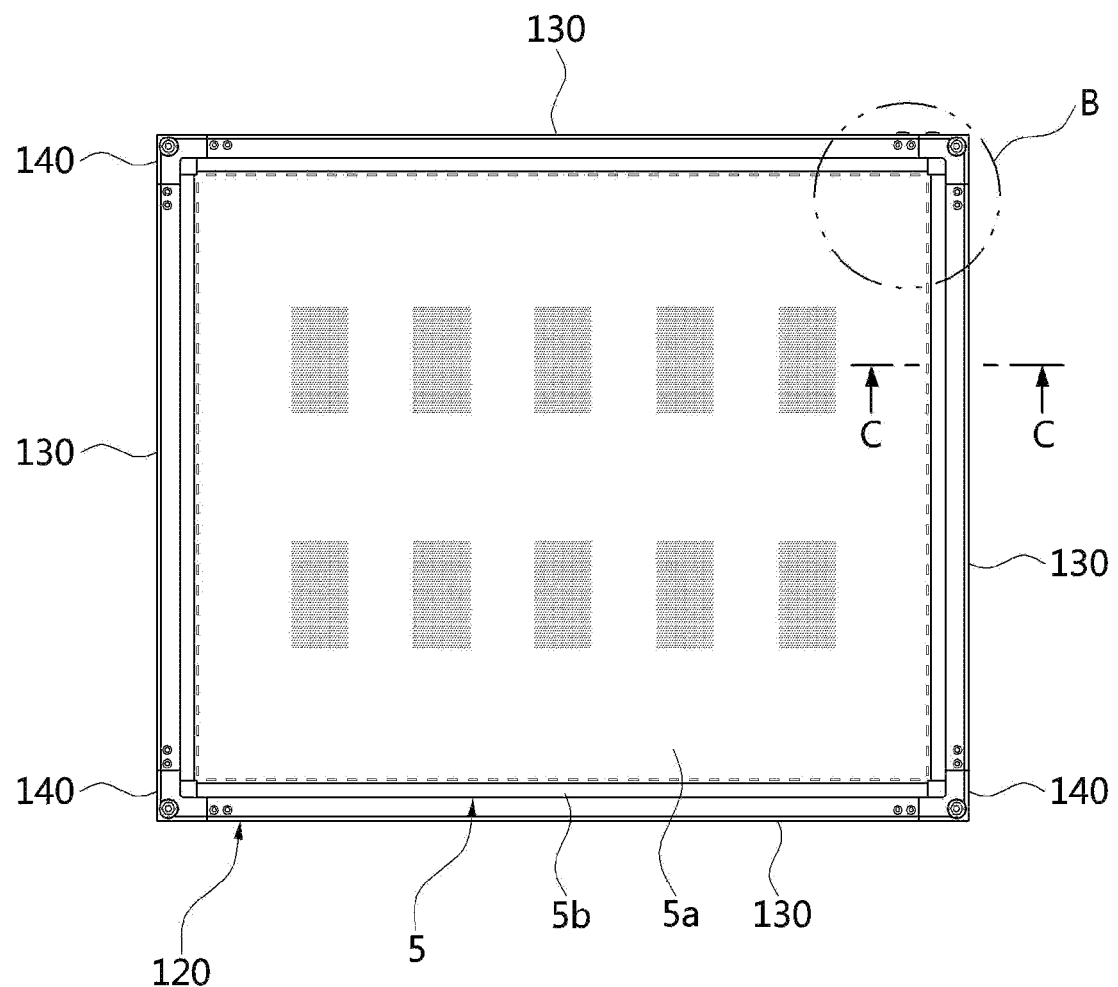
FIG. 3 is a bottom view illustrating the state of a printing screen mounted to an apparatus for securing a printing screen frame according to the present invention.

As illustrated in FIG. 3, an apparatus for securing a printing screen frame of the present invention is configured such that a printing screen unit 5 is replaced or tensioned by a frame fixing means 120 manufactured in a rectangular frame shape by using multiple mounting frames 130 and multiple corner pieces 140.

That is, each of the mounting frames 130 is made of an aluminum material to have a predetermined length by extrusion molding and includes: an air pressure supply hole 131 longitudinally formed therethrough along a longitudinal direction thereof when each of the corner pieces 140 and each of the mounting frames 130 are connected to each other at an inner corner of the inner ceiling of the apparatus; and a cavity 132 longitudinally formed therethrough along the longitudinal direction thereof in the remaining section except for a portion in which the air pressure supply hole 131 is formed.

In this case, the cavity 132 is configured in a rectangular shape having a left and right width having a size larger than a vertical height, and includes: an operation guide hole 133 longitudinally formed in the middle of the bottom of the cavity along a longitudinal direction of the mounting frame 130; holding grooves 134 and 135 formed at an inner corner of the ceiling of the cavity and the outer corner of the bottom thereof, respectively, such that a tension action part 150 is held therein and the position thereof is fixed when the tension action part 150 is longitudinally inserted into the cavity 132 along a longitudinal direction thereof; and an inclined surface 136 provided at a bottom of the cavity 132 stretching toward the outside with the operation guide hole 133 in the middle of the bottom of the cavity, the inclined surface 136 decreasing in height from the operation guide hole 133 toward the outer end thereof.

The tension action part 150 is configured to include a cylinder tube block 151 longitudinally inserted into the cavity along the longitudinal direction thereof to be in close contact with the outer side surface, ceiling, and bottom of the cavity 132 and held by a holding step, the cylinder tube block having multiple cylindrical holes 151a provided to be spaced apart by a predetermined distance from the inner surface of the cavity 132; a piston rod 152 inserted tightly into each of the multiple cylindrical holes 151a, respectively, to be horizontally moved, the piston rod having a head part 152a and a rod part 152b; a rod cover 153 screwed to an outer end of the cylindrical hole 151a via an O-ring 159, the rod cover having a through hole 153a formed therein such that the rod part 152b tightly pass through the through hole to be horizontally moved; an elastic spring 154 fitted between the head part 152a and the rod cover 153 inside the cylindrical hole 151a to apply elastic force to the piston rod 152 toward the inside of the cylindrical hole 151a; and a tension member 155 longitudinally inserted into the cavity 132 along the longitudinal direction thereof, and coupled to an outer end of each of the rod parts 152b of the multiple piston rods 152 via multiple fastening screws 158 at the same time, the tension member being slid in a horizontal direction such that a coupling protrusion 155a of a lower surface of the tension member protrudes through the operation guide hole 133 to be coupled to or separated from a support frame 5b of the printing screen unit 5.

In this case, the cylinder tube block 151 is made of an aluminum material to have a predetermined length by extrusion molding to have a rectangular shape having a left and right width having a size larger than a vertical height, and includes: the multiple cylindrical holes 151a formed in the inner side surface of the cylinder tube block to be horizontal thereto and to have predetermined depths, with partition walls 151b arranged at regular intervals between the cylindrical holes, respectively, along the longitudinal direction of the cylinder tube block; an air press release hole 151c formed in an inner end of each of the partition walls 151b to have the same height and width, and defining a passage such that air supplied through a first air inlet 142 of the corner piece 140 pushes the head parts 152a of the piston rods 152 at the same time in a direction of releasing pressure applied to the support frame so that the head parts are moved rearwards; an air pressure hole 151d formed in the middle of each of the partition walls 151b to have the same height and width, and defining a passage such that air supplied through a second air inlet 144 of the corner piece 140 pushes the head parts 152a of the piston rods 152 at the same time in a direction of applying pressure to the support frame so that the head parts are moved forwards; and holding protrusions 151e and 151f provided at an upper end corner of the inner side surface of the cylinder tube block and a lower end of an outer side surface thereof, respectively, by protruding therefrom, and held correspondingly in the holding grooves 134 and 135 formed in the inner corner of the ceiling of the cavity 132 and the outer corner of the bottom thereof, respectively, so that the position of the cylinder tube block 151 is fixed.

An O-ring 156 is coupled to an outer circumferential surface of the head part 152a of the piston rod 152, the O-ring 156 sealing a gap between an inner circumferential surface of the cylindrical hole 151a of the cylinder tube block 151 and the head part 152a; an O-ring 157 is coupled to an outer circumferential surface of the rod part 152b spaced apart by a predetermined distance from an end thereof, the O-ring 157 sealing a gap between an inner circumferential surface of the rod cover 153 and the rod part 152b; and a stop protrusion 152c is provided on an outer circumferential surface of the rod part 152b located at a predetermined distance from the end thereof, the stop protrusion 152c controlling the piston rod 152 such that the piston rod 152 is held in the rod cover 153 when the piston rod 152 is moved in the direction of releasing the pressure so that the elastic spring 154 is not compressed at desired pressure or more.

The tension member 155 is made of an aluminum material and is configured to have a predetermined length by extrusion molding such that the coupling protrusion 155a provided at a middle of a lower part of the tension member by protruding therefrom has an L shape, wherein an inclined surface 155b is formed on an end of the lower surface of the tension member 155, the inclined surface 155b being correspondingly engaged with the inclined surface 136 formed at the bottom of the cavity 132 such that the tension member is stopped after the tension member 155 is moved by a second pressure, and decreasing in height from the coupling protrusion 155a toward an outer end of the inclined surface 155b.

Next, the operation and effects of the apparatus for securing a printing screen frame of the present invention having the configuration described above will be described.

Figure 4A:
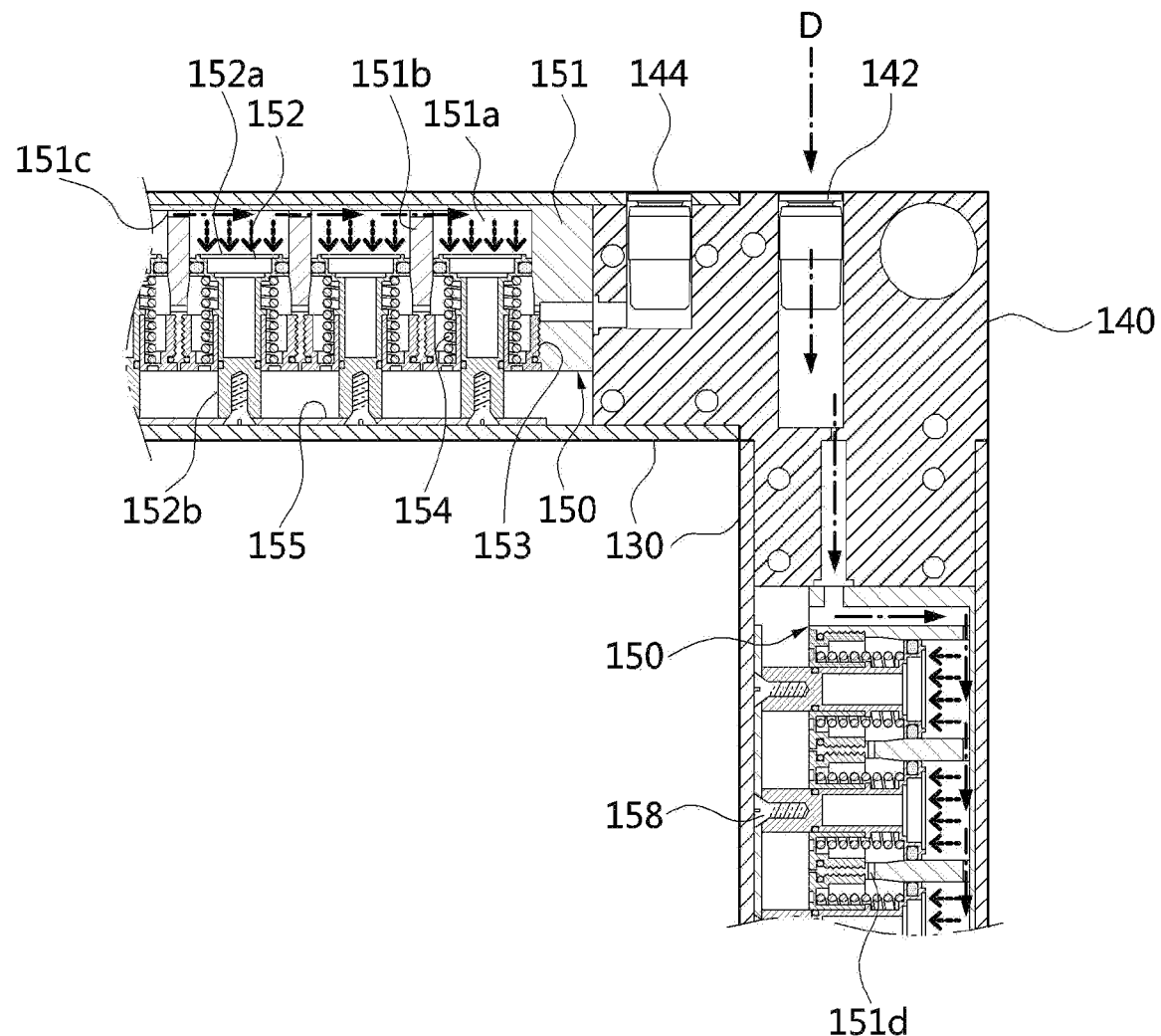
FIGS. 4a and 4b are extended sectional views illustrating a B portion of FIG. 3, FIGS. 5a and 5b are a bottom perspective view and a top perspective view, respectively, illustrating the state of cylinder tube blocks connected to each other by corner pieces according to the present invention.

According to the apparatus for securing a printing screen frame of the present invention including the frame fixing means 120 manufactured in a rectangular frame shape by the multiple mounting frames 130 having the tension action parts 150 therein and corner pieces 140, when air is exhausted in a few seconds after the air is introduced through the first air inlet 142 formed in a side of the corner piece 140 in the direction of an arrow D in FIG. 4(a), the lift operation part (not shown) of the corner piece 140 is operated first as in the conventional configuration by adjusting the supply speed of the air pressure by an orifice. In this case, the lift operation part lifts the support frame 5b to support the edge of the support frame 5b of the printing screen unit 5, and at the same time, corresponds the tension action part 150 to the support frame 5b of the printing screen unit 5 to be engaged with each other. Next, while the tension action part 150 configured according to the present invention is moved forward by the elastic force during the release of the supply of air pressure after being moved rearwards by air pressure supplied at intervals of several seconds, the tension action part 150 pulls the support frame 5b of the printing screen unit 5 engaged with the edge of the printing screen unit 5 in all directions. Accordingly, the tension action part 150 applies tensile force to a printing screen 5a so that printing screen 5a maintains a tightly tensioned state.

Figure 7A:
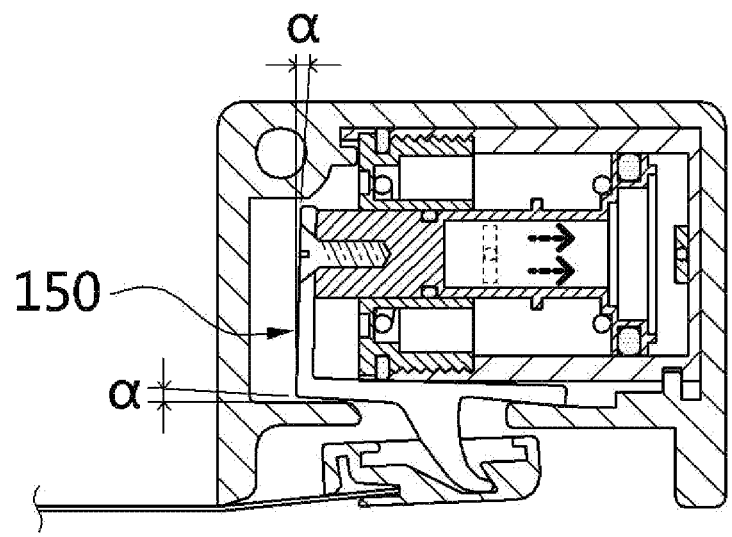
FIG. 7d illustrates cross-sectional views of a tension action part taken along line C-C of FIG. 3.
Figure 7B:
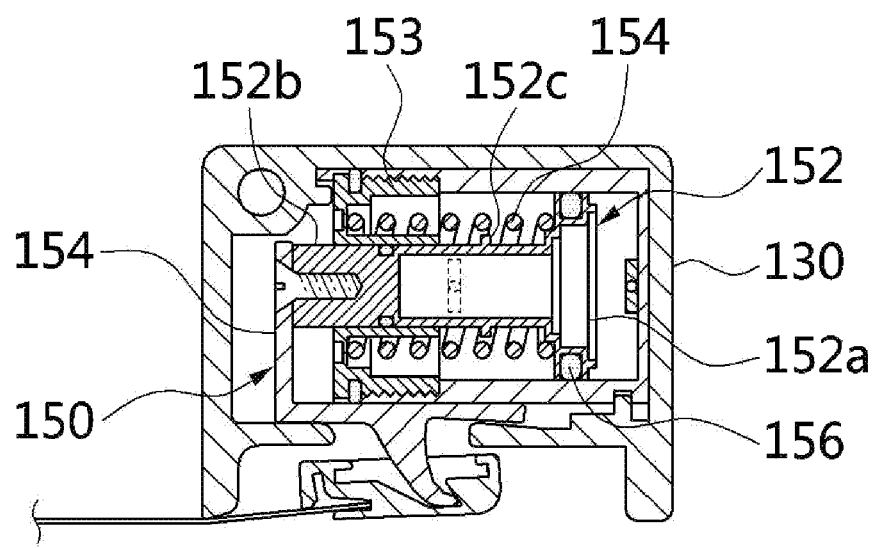
Figure 7C:
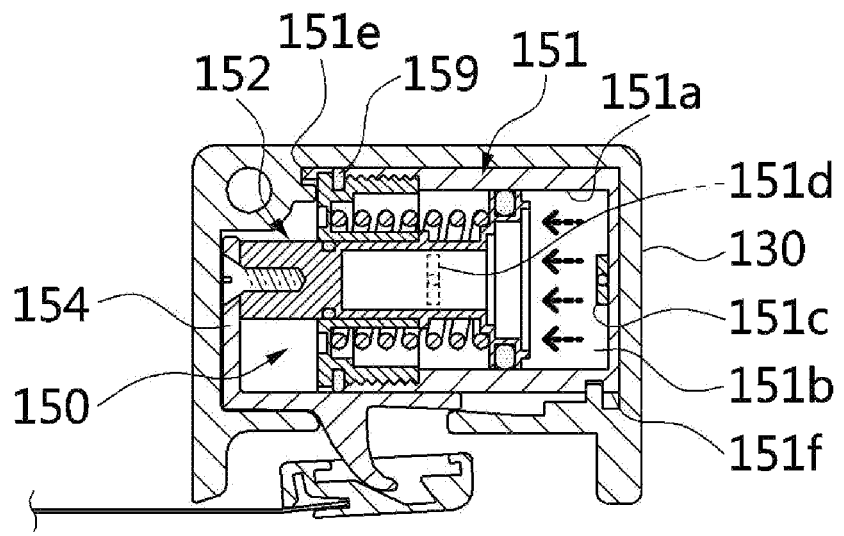
Figure 7D:
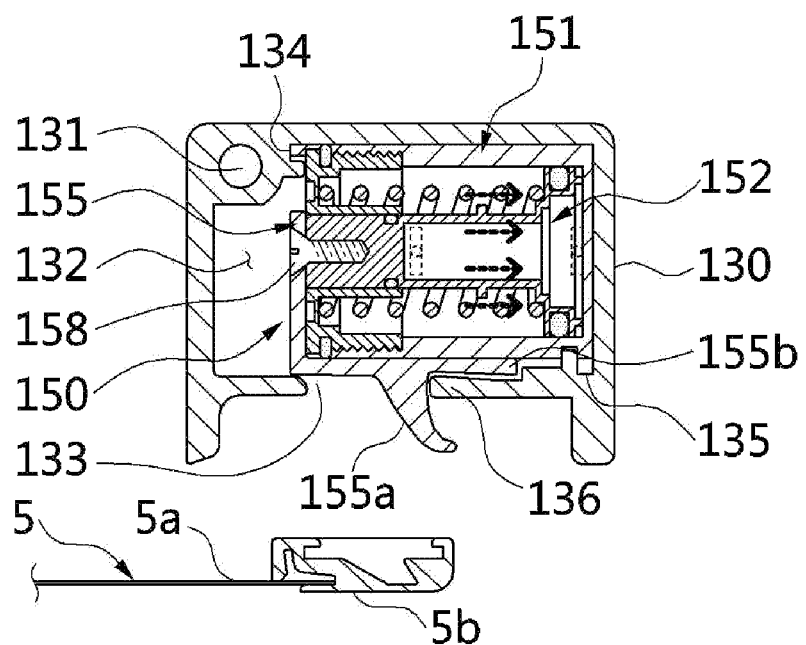

That is, when air is supplied through the air press release hole 151c formed in each of the multiple cylindrical holes 151a of the cylinder tube block 151 of the tension action part 150, the air pressure due to the air pushes the piston rod 152 located as in FIG. 7(d) to be moved rearwards; at the same time, moves the tension member 155 coupled to the end of the rod part 152b of the piston rod 152 by the fastening screw 158 rearwards; and the coupling protrusion 155a protruding from the lower surface of the tension member 155 is engaged with the support frame 5b of the printing screen unit 5 which is waiting by the lifting operation of the lift operation part (not shown) of the corner piece 140 operating a few seconds earlier as illustrated in FIG. 7(c).

In this state, when the supply of the air pressure supplied in the direction of the arrow D in FIG. 4(a) stops, air pressure in the cylindrical hole 151a of the cylinder tube block 151 is released as illustrated in FIG. 7(b). Accordingly, the elastic spring 154 which is compressed is extended and moves the piston rod 152 forwards, and at the same time, advances the tension member 155 coupled to the end of the rod part 152b to the outside. Accordingly, the elastic spring 154 allows the support frame 5b of the printing screen unit 5 engaged with the coupling protrusion 155a of the tension member 155 to be pulled in all directions, and allows the tensile force to be applied to the printing screen 5a such that the printing screen 5a maintains the tightly tensioned state.

In this case, since the elastic spring 154 is operated only by a predetermined elastic force, it is impossible to further increase the tensile force according to the change in the tensile value of the printing screen 5a which stretches during a long period of use. However, when air is supplied to a middle portion of the cylindrical hole 151a of the cylinder tube block 151 located between the head part 152a of the piston rod 152 and the rod cover 153, the piston rod 152 is further moved forwards, and the tension member 155 can be moved forwards.

Figure 4B:
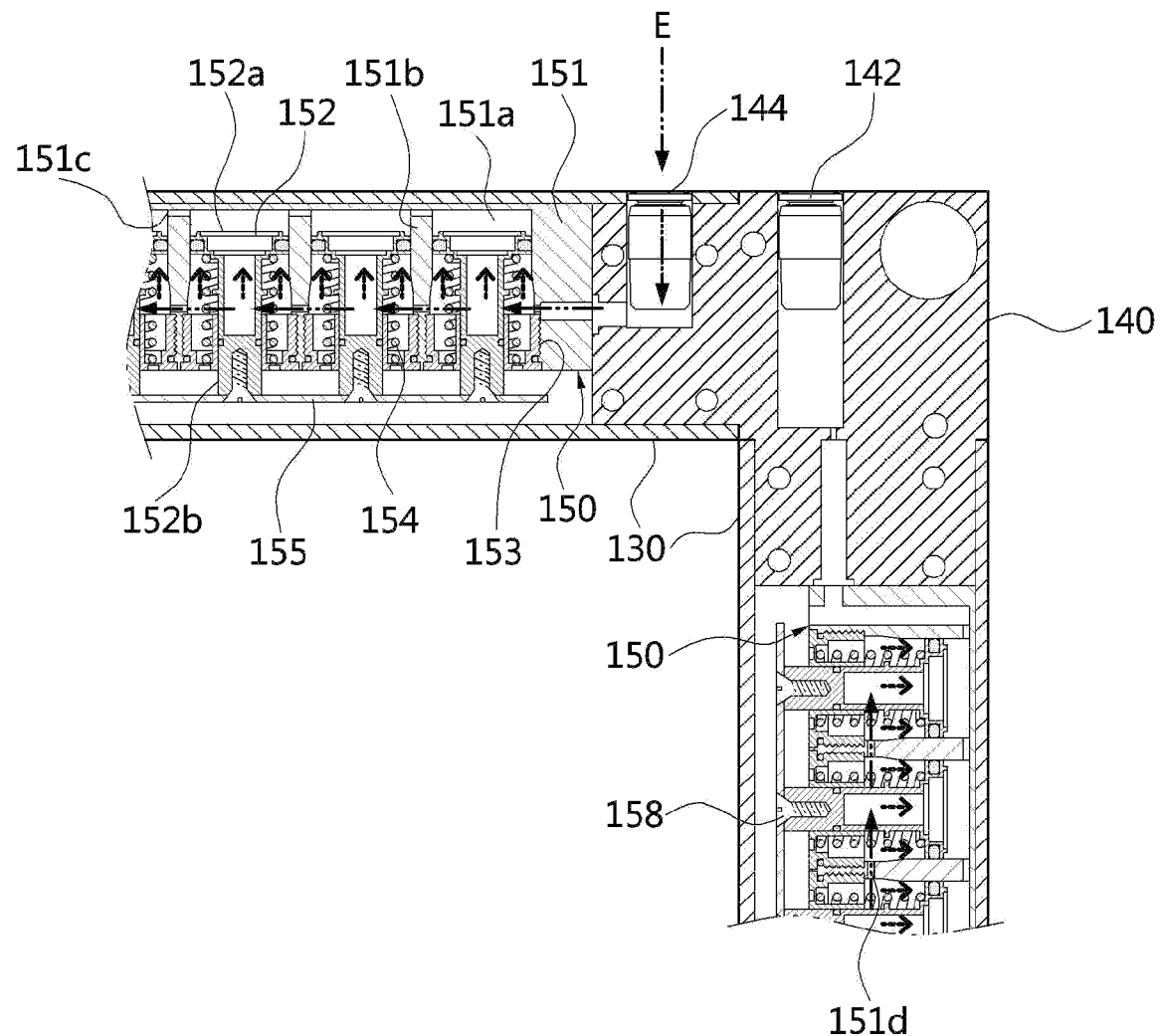
Figure 5A:
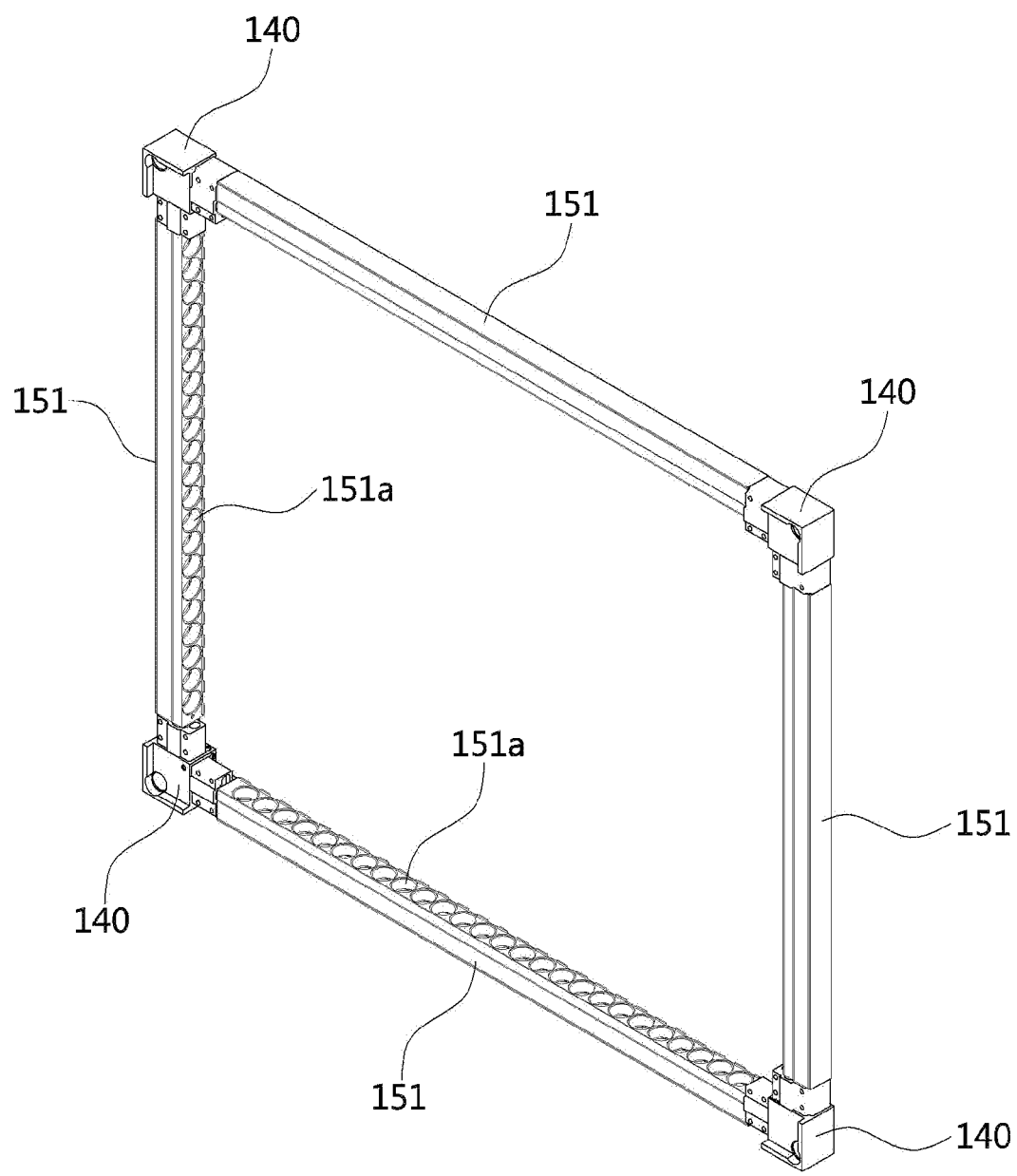
Figure 5B:
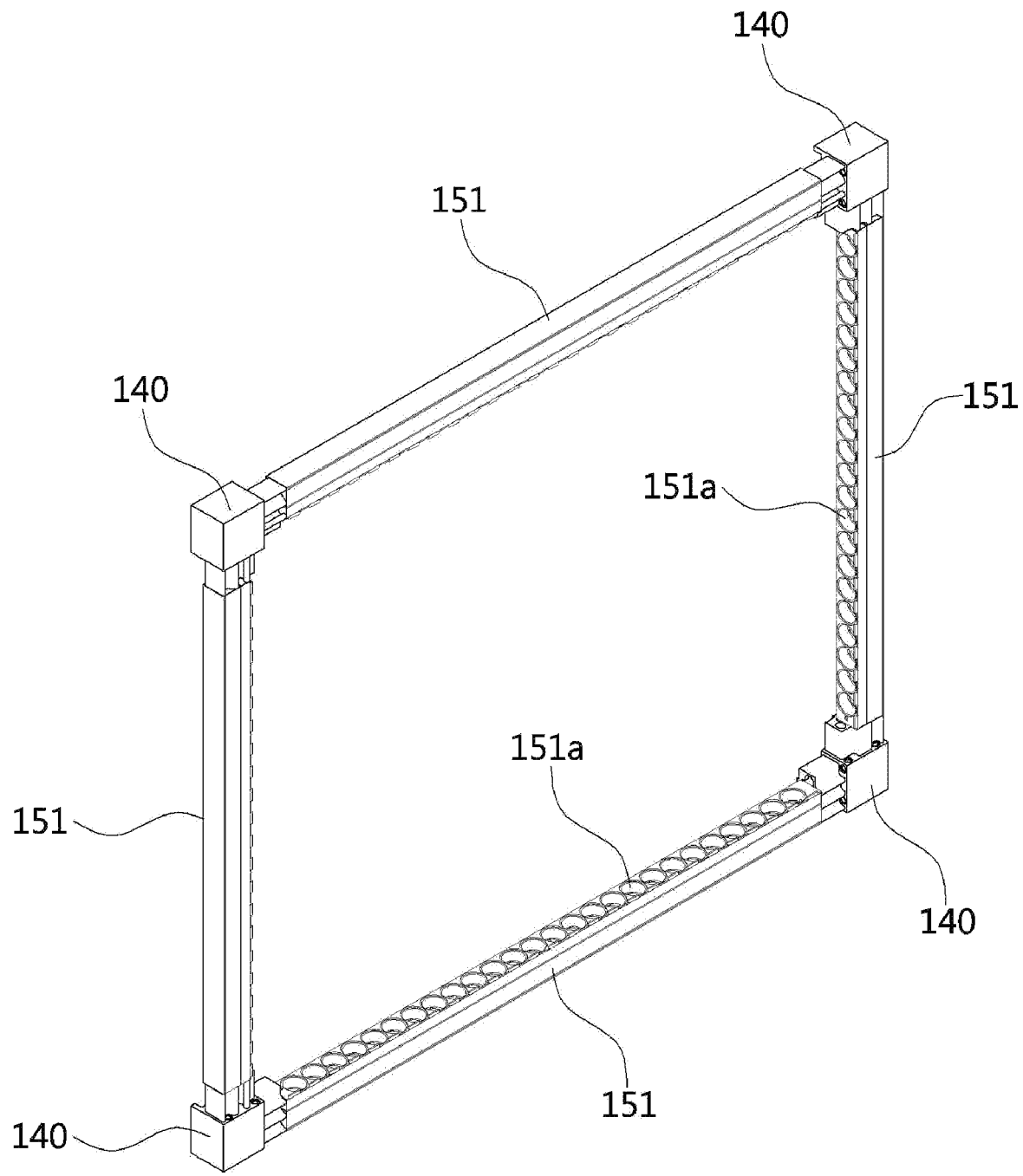
Figure 6:
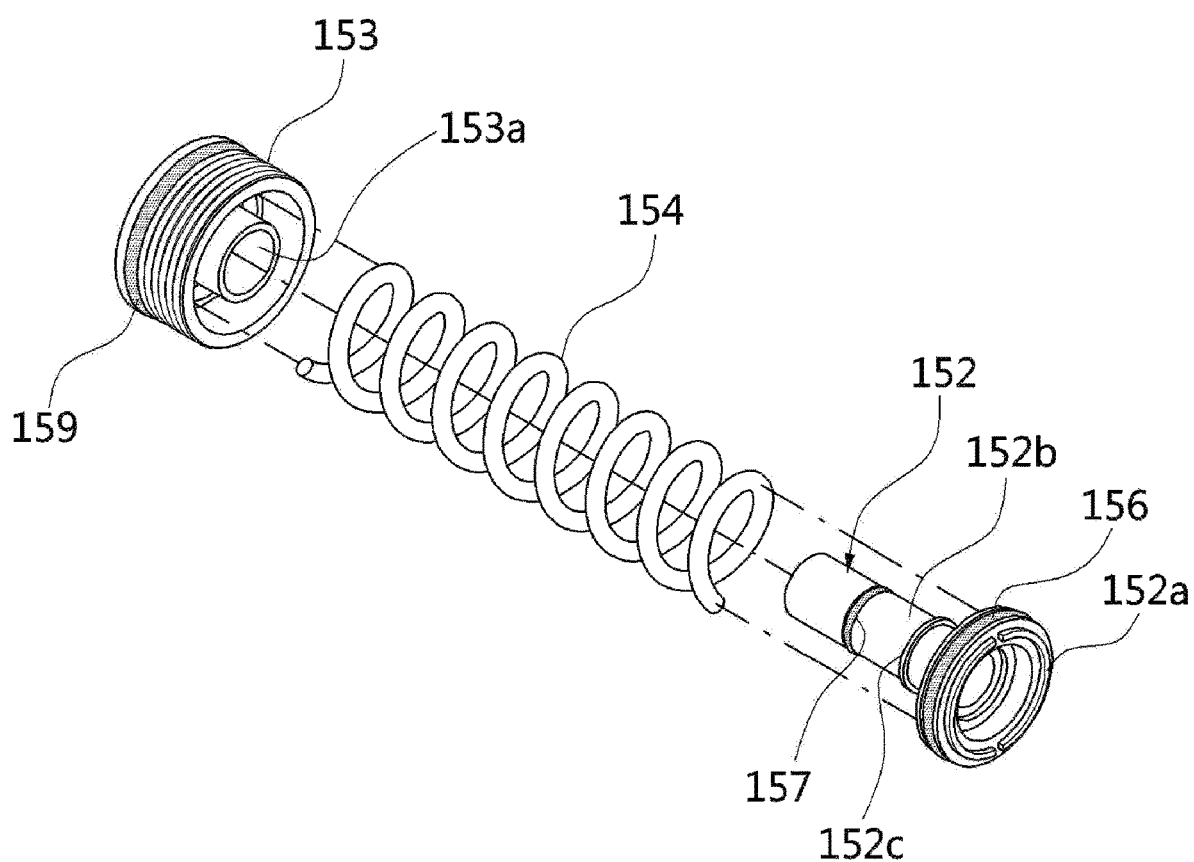
FIG. 6 is an exploded perspective view illustrating a piston rod, an elastic spring, and a rod cover according to the present invention, FIG. 7a, FIG. 7b, FIG. 7c
Figure 8:
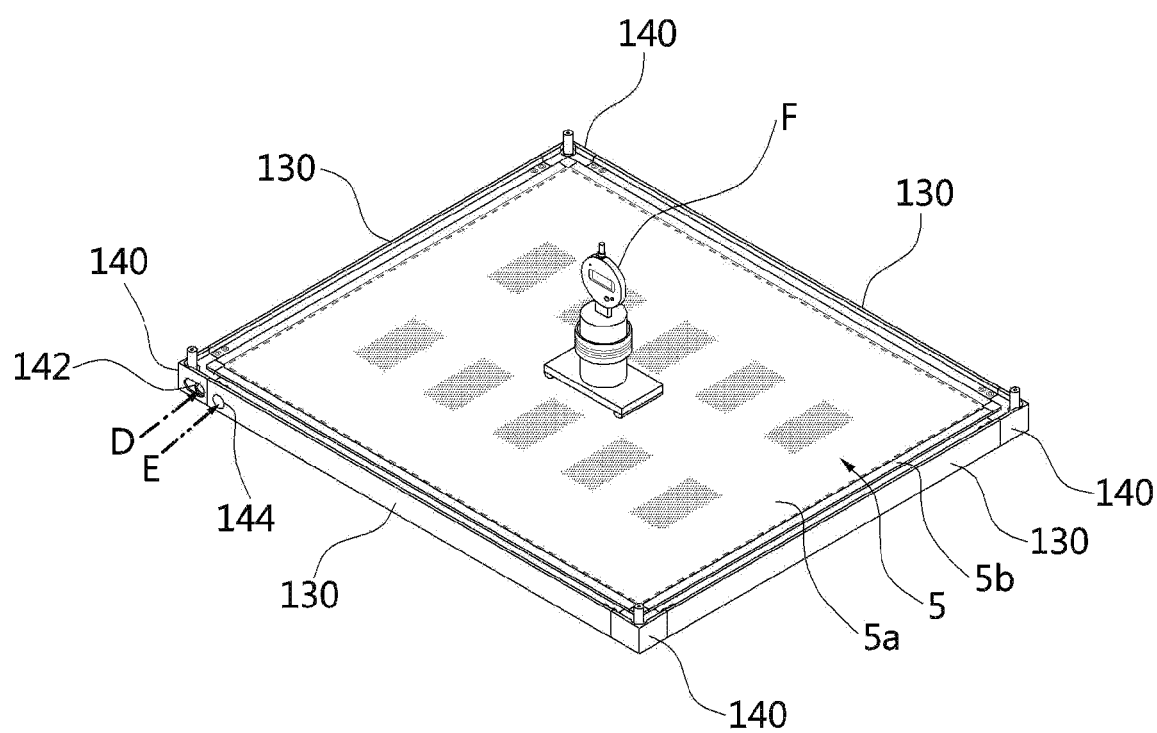
FIG. 8 is a view illustrating the state of a tension measuring instrument used for describing the process of adjusting an air injection amount by using desired tensile force indicated by the tension measuring instrument placed on the center of the printing screen according to the present invention.

That is, in the case of the readjustment of increasing the tensile force according to change in the tensile value of the printing screen 5a which stretches during a long period of use, when air is introduced through the second air inlet 144 of the corner piece 140 in the direction of an arrow E illustrated in FIG. 4(b) while the data value of a tension measuring instrument F arranged on the center of the printing screen 5a as illustrated in FIG. 8 is first checked, air pressure due to the air is supplied to the middle portion of the cylindrical hole 151a between the head part 152a of the piston rod 152 and the rod cover 153 through the air pressure hole 151d formed in the middle of each of the partition walls 151b connecting the multiple cylindrical holes 151a of the cylinder tube block 151. Accordingly, as illustrated in FIG. 7(a), the piston rod 152 is further moved forwards and at the same time, the tension member 155 is moved forwards. Accordingly, reverse pressure can be applied to the printing screen by the air pressure such that the printing screen 5a supported by the support frame 5b is tensioned in all directions while the support frame 5b of the printing screen unit 5 engaged with the coupling protrusion 155a of the tension member 155 is further moved forwards.

In this case, during the reverse pressure by the air pressure, as illustrated in FIG. 7(a), when the piston rod 152 is moved forwards, the advancing force of a vertical end of the tension member 155 coupled to the end of the rod part 152b via the fastening screw 158, and the force of the coupling protrusion 155a of the horizontal end of the tension member 155 resisting upward movement thereof due to being engaged with the support frame 5b of the printing screen unit 5 collide with each other, so the tension member 155 is twisted at a predetermined angle α. Accordingly, in the twisted state of the tension member 155, although the air pressure supplied to the second air inlet 144 is released, the engaged state of the tension member with the support frame can be maintained due to the strong friction of the inclined surface 136 formed in the bottom of the cavity 132 with the inclined surface 155b formed on the end of the lower surface of the tension member 155, so the reverse pressure applied to the printing screen 5a is not released.

Of course, as illustrated in FIG. 7(c), to release the tension caused by the piston rod 152 during the reverse pressure by the air pressure, the tension member 155 coupled to the end of the rod part 152b of the piston rod 152 is moved backward by the air pressure supplied to the air press release hole 151c at the inner side of the cylindrical hole 151a through the first air inlet 142. Accordingly, the twisted angle and the friction which is caused by the engagement of the inclined surface 136 and 155b are released, so the printing screen unit 5 can be returned to an initial state to be replaced.

Accordingly, the apparatus for securing a printing screen frame according to the present invention is configured so that, when the piston rod 152 moves backward due to the supply of air pressure, tensile force applied to the support frame 5b of the printing screen unit 5 by the coupling protrusion 155a of the tension member 155 is released and the printing screen unit 5 can be replaced, and, when the piston rod 152 moves forward as the elastic spring 154 extends due to the stop of the supply of the air pressure, the coupling protrusion 155a of the tension member 155 is caught on the support frame 5b of the printing screen unit 5 and applies pressure thereto due to elastic force so as to tension the printing screen 5a, and then the reverse pressure can be applied thereto by using air pressure, as needed. Accordingly, the apparatus can be used semi-permanently without being deformed or damaged due to foreign matters or friction, and, at the same time, insufficient tensile force can be readjusted according to change in the tensile value of the printing screen 5a which stretches during a long period of use.

Particularly, the mounting frame 130 and the tension action part 150 constituting the frame fixing means 120 allow the tensile force to be adjusted and readjusted to desired tensile force to prevent the printing screen 5a from stretching during a long period of use or to meet the trend of thinning the printing screen 5a, thereby maintaining constant product quality and extending the life of the printing screen 5a.

Meanwhile, the present invention is not limited to the above-described embodiments, but amendments and modifications are possible within a range of not departing from the gist of the present invention. The technical spirit to which such amendment and modification was applied should also be regarded as belonging to the following claims.

The invention claimed is:

1. A printing screen frame apparatus configured such that a printing screen unit (5) is replaced or tensioned by a frame fixing means (120) formed in a rectangular frame shape with multiple mounting frames (130) having tension action parts (150) therein and multiple corner pieces (140), the apparatus comprising:

each of the tension action parts (150) comprising: a cylinder tube block (151) provided in a cavity (132) to be coupled to each of the mounting frames (130) by being spaced apart by a predetermined distance from an inner side surface of the cavity (132) of the mounting frame (130) and having multiple cylindrical holes (151a) provided on the cylinder tube block along a longitudinal direction thereof, with partition walls (151b) arranged at regular intervals between the cylindrical holes, respectively; multiple piston rods (152) inserted tightly into the multiple cylindrical holes (151a), respectively, to be horizontally moved, and having head parts (152a) and rod parts (152b); multiple rod covers (153) screwed to outer ends of the multiple cylindrical holes (151a), each of the rod covers having a through hole (153a) formed therein such that each of the rod parts (152b) tightly passes through the through hole to be horizontally moved; multiple elastic springs (154) fitted between the head parts (152a) and the rod covers (153), respectively, inside the cylindrical holes (151a), each of the elastic springs applying elastic force toward an inside of each of the cylindrical holes (151a); and multiple tension members (155) longitudinally inserted in cavities (132) of the mounting frames along longitudinal directions thereof, each of the tension members being coupled to an outer end of each of the rod parts (152b) at the same time, and being slid in a horizontal direction such that a coupling protrusion (155a) of a lower surface of a tension member protrudes through an operation guide hole (133) to be coupled to or separated from a support frame (5b) of the printing screen unit (5).

2. The apparatus of claim 1, wherein an inclined surface (136) is provided on a bottom of the cavity (132), the inclined surface decreasing in height from the operation guide hole (133) toward an outer end thereof, and an inclined surface (155b) is provided on an end of a lower surface of the tension member (155) to be correspondingly engaged with the inclined surface (136) of the cavity (132) and be stopped after the tension member (155) is moved by a second pressure, the inclined surface decreasing in height from the coupling protrusion (155a) toward an outer end thereof.

3. The apparatus of claim 1, wherein the cylinder tube block (151) comprises: the multiple cylindrical holes (151a) provided in an inner side surface of the cylinder tube block to be horizontal thereto and to have predetermined depths, with the partition walls (151b) arranged at the regular intervals between the cylindrical holes, respectively, along the longitudinal direction of the cylinder tube block; an air press release hole (151c) formed in an inner end of each of the partition walls (151b), and defining a passage such that air supplied through a first air inlet (142) of a corner piece (140) pushes the head parts (152a) of the piston rods (152) at the same time in a direction of releasing pressure applied to the support frame so that the head parts are moved rearwards; and an air pressure hole (151d) formed in a middle of each of the partition walls (151b), and defining a passage such that air supplied through a second air inlet (144) of the corner piece (140) pushes the head parts (152a) of the piston rods (152) at the same time in a direction of applying pressure to the support frame so that each of the head parts is moved forwards.

4. The apparatus of claim 3, wherein each of the air press release hole (151c) and the air pressure hole (151d) is configured to maintain a predetermined distance from each other in the partition wall (151b) and to have the same height and width.

5. The apparatus of claim 3, wherein the air press release hole (151c) supplies air to an inner space of the cylindrical hole (151a) partitioned by the head part (152a) of the piston rod (152) and the air avoids mixing with air passing through the air pressure hole (151d).

6. The apparatus of claim 3, wherein the air pressure hole (151d) supplies air to an outer space of the cylindrical hole (151a) partitioned by the head part (152a) of the piston rod (152) and the air avoids mixing with air passing through the air press release hole (151c).

7. The apparatus of claim 1, wherein a stop protrusion (152c) is provided on an outer circumferential surface of the rod part located at a predetermined distance from an end of the rod part (152b), the stop protrusion being caught on the rod cover (153) when the piston rod (152) is moved in a direction of releasing pressure applied to the support frame and controlling the elastic spring (154) such that the elastic spring is not compressed at desired pressure or more.

8. The apparatus of claim 1, wherein holding grooves (134) and (135) are provided at an inner corner of a ceiling of the cavity (132) and an outer corner of a bottom thereof, respectively, so that the tension action part (150) is held therein and a position thereof is fixed when the tension action part (150) is longitudinally inserted into the cavity (132) in the longitudinal direction thereof, and holding protrusions (151e) and (151f) are provided at an upper end corner of an inner side surface of the cylinder tube block (151) and a lower end of an outer side surface thereof, respectively, by protruding therefrom to be correspondingly held in the holding grooves (134) and (135) of the cavity (132) such that a position of the cylinder tube block (151) is fixed.

\* \* \* \* \*